United States Patent [19]

Fujioka

[11] Patent Number: 4,753,004
[45] Date of Patent: Jun. 28, 1988

[54] CHIP MOUNTER

[75] Inventor: Teruhiko Fujioka, Shinjuku, Japan

[73] Assignee: Tenryu Technics Co., Ltd., Shizuoka, Japan

[21] Appl. No.: 19,027

[22] Filed: Feb. 26, 1987

[30] Foreign Application Priority Data

Feb. 28, 1986 [JP] Japan .................. 61-29400[U]

[51] Int. Cl.⁴ .............................................. H05K 3/30
[52] U.S. Cl. ....................................... 29/740; 29/743; 294/2; 294/64.1
[58] Field of Search ................. 29/740, 743, 759, 840; 228/6 R, 6 A; 294/2, 64.1

[56] References Cited

U.S. PATENT DOCUMENTS 4,438,559  3/1984  Asai et al. .............................. 29/740
4,515,507  5/1985  Asai et al. .......................... 29/743 X Primary Examiner—Carl E. Hall
Attorney, Agent, or Firm—Kane, Dalsimer, Sullivan, Kurucz, Levy, Eisele, and Richard

[57] ABSTRACT

A chip mounter for automatically mounting an electronic part onto a substrate. The chip mounter has a sucker for vacuum-holding the electronic part, at least one pair of fingers capable of reciprocatively moving between an electronic part clamping position and a release position and of also moving vertically, and a guide for guiding the fingers so that they perform linear reciprocative movement. Positioners for clamping the electronic part are disposed on the respective distal ends of the fingers in such a manner that their positions are adjustable in the clamping direction.

5 Claims, 5 Drawing Sheets 4,753,004

CHIP MOUNTER

BACKGROUND OF THE INVENTION

1. Field of the Invention

The present invention relates to a chip mounter for mounting a chip such as a semiconductor chip onto an IC (Integrated Circuit) substrate or the like.

2. Related Art Statement

In this type of conventional chip mounter, each of the fingers for clamping a chip is provided so as to be pivotal about one axis.

In the conventional chip mounter of the type described above, since the fingers are arranged to pivot in order to clamp a chip, the direction of movement of each finger is not parallel to the surface on which the chip is to be mounted. Accordingly, the prior art suffers from the problems that it is difficult to clamp the chip stably and a complicated and troublesome operation is needed to exchange parts in order to enable the chip mounter to clamp chips having different sizes.

SUMMARY OF THE INVENTION

It is an object of the present invention to provide a chip mounter which is capable of effectively mounting a chip onto a substrate or the like by reliably clamping the chip.

It is another object of the present invention to provide a chip mounter having general-purpose properties which enable it to mount a plurality of different kinds of chips interchangeably.

To these ends, the present invention provides a chip mounter comprising: a sucker capable of suction-holding a chip such as a semiconductor chip or the like, the sucker being provided so as to be vertically movable; at least a pair of fingers provided in the vicinity of the sucker so as to be reciprocatively movable between two positions, that is, a first position where the fingers clamp the chip and a second position where the fingers release the chip, the fingers being also adapted to be vertically movable; and guide means for guiding the fingers so that they perform linear reciprocative movement.

Thus, in the chip mounter according to the present invention, the fingers are horizontally moved between the chip clamping position and the chip releasing position interconnectively with the vertical movement of the sucker tube of the sucker.

BRIEF DESCRIPTION OF THE DRAWINGS

The above and other objects, features and advantages of the present invention will become more apparent from the following description of a preferred embodiment thereof taken in conjunction with the accompanying drawings, in which.

DETAILED DESCRIPTION OF THE PREFERRED EMBODIMENT

Figure 1:
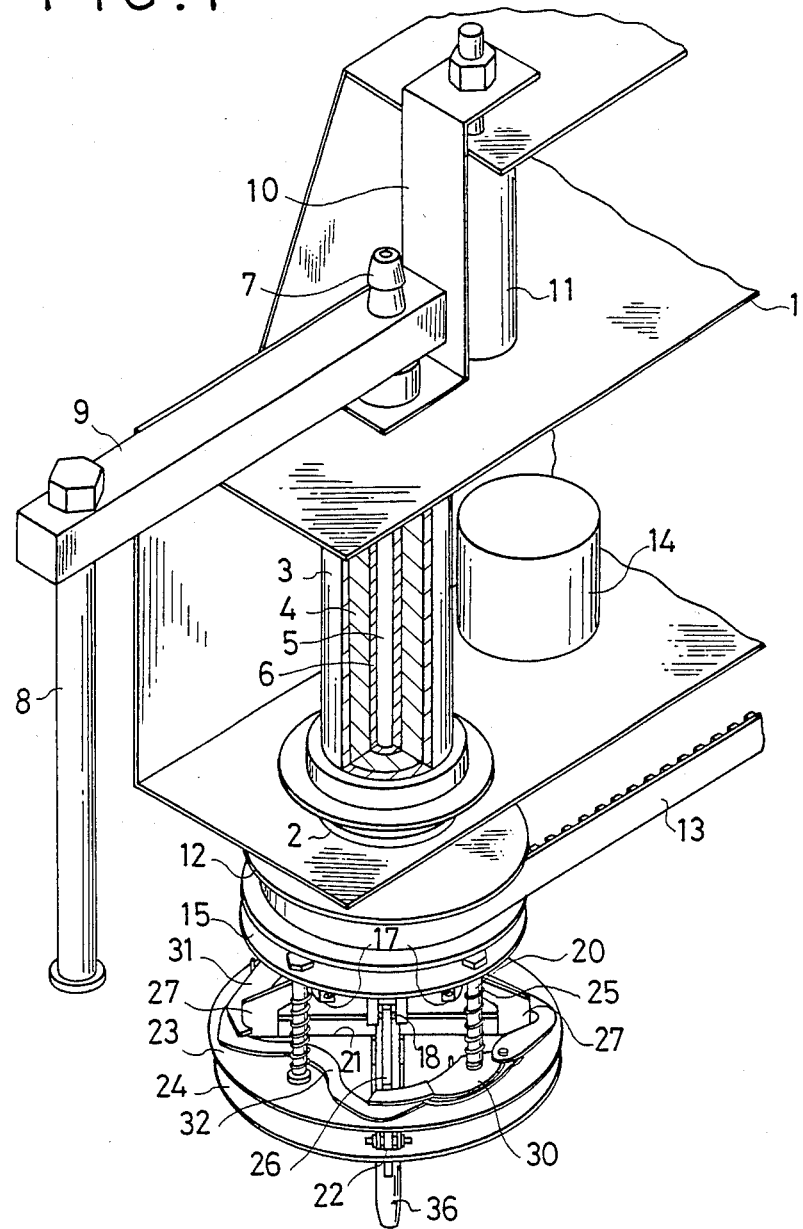
FIG. 1 is a perspective view of one embodiment of the chip mounter according to the present invention.

Referring to the drawings, a sleeve 3 is rotatably supported by a support frame 1 through a ball bearing 2, and a spline linear bearing 4 is inserted into and rigidly secured to the inside of the sleeve 3. A spindle 6 having a suction bore 5 extending therethrough is received in the spline linear bearing 4 in such a manner that the spindle 6 is movable only vertically.

A nipple 7 for connection with a vacuum pump (not shown) is attached to the upper end of the spindle 6. A columnar rod 8 is connected to the upper portion of the spindle 6 through an arm 9, the rod 8 being adapted to apply driving force to a chip feeder (not shown) for supplying chips to this chip mounter. The upper portion of the spindle 6 is further connected through a connecting plate 10 to a piston rod of an air cylinder 11 which serves as a driving means.

A toothed pulley 12 is fitted on the lower end portion of the sleeve 3 in such a manner that the pulley 12 rotates together with the sleeve 3 in one unit. The pulley 12 is connected to a motor 14 through a belt 13.

A ring 16 is fitted on the lower end of the sleeve 3, the ring 16 being provided with a flange portion 15 having substantially the same diameter as that of the pulley 12. Four roller clamping portions 17 are provided on the lower surface of the ring 16 so as to project from respective positions which are equally spaced apart from each other, the roller clamping portions 17 supporting two opposing pairs of rollers 18 and 19. The rollers 18 and 19 are rotatably carried on respective shafts in such a manner that the two opposing pairs of rollers 18, 19 are disposed on different levels from each other in terms of the vertical direction.

Four support rods 20 which serve as support members are secured to the flange portion 15 at respective positions which are equally spaced apart from each other in such a manner that the support rods 20 extend therefrom downwardly. Two disks 23 and 24 which serve as guide plates are vertically movably mounted on the support rods 20, the disks 23 and 24 respectively having cross-shaped slide grooves 21 and 22 which are defined by cross-shaped slit-like openings, and the disks 23 and 24 being connected together and retained with a predetermined spacing provided therebetween. The disks 23 and 24 are normally biased downward by means of springs 25, and prevented from falling by an E-ring (not shown) provided at the lower end of each support rod 20.

Figure 5:
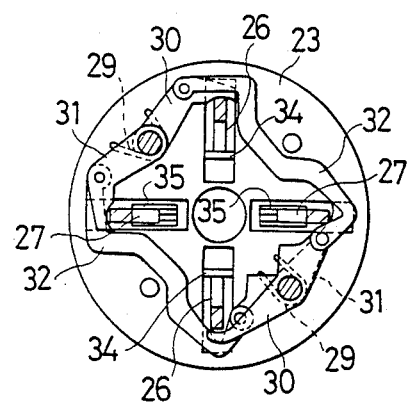
FIGS. 5 and 6 are fragmentary plan views illustrating fingers, push levers, equalizers and springs in their assembled state.
Figure 6:
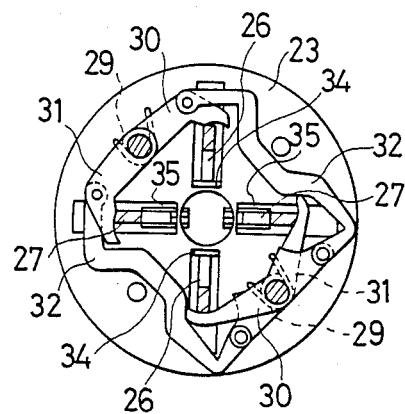
Figure 7:
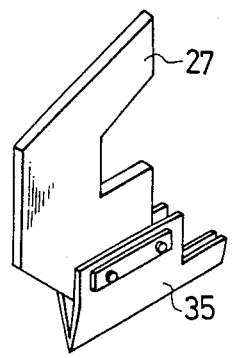
FIGS. 7 and 8 are perspective views illustrating positioners in their assembled state.
Figure 8:
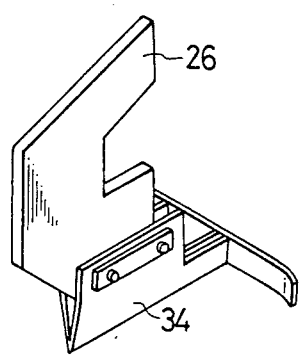

Each of the fingers 26 and 27 having a substantially U-shaped configuration in a side view supports at its lower portion a pair of rollers 28 which are in slide contact with the slide grooves 21 and 22 provided in the disks 23 and 24, the rollers 28 being movable horizontally through the area defined between the disks 23 and 24 while being guided by the disks 23 and 24. By virtue of the engagement between the rollers 28 and the slide grooves 21 and 22, the fingers 26 and 27 are retained horizontally movably along the disks 23 and 24, and the upper ends of the fingers 26 and 27 face the rollers 18 and 19, respectively. In addition, the fingers 26 and 27 are biased inward through two pairs of push levers 30 and 31 which are, in turn, biased by springs 29 serving as biasing means which are wound around two of the support rods 20 as shown in FIGS. 5 and 6, and the two opposing pairs of fingers 26 and 27 can be moved by equal distances by the action of a pair of equalizers 32, respectively, which are pivotally supported between the push levers 30 and 31. A pair of slots 33 are provided in the distal end of each of the fingers 26 and 27 in such a manner that the slots 33 extend through the wall of the corresponding finger. As shown in FIGS. 7 and 8, positioners 34 and 35 for clamping and positioning a chip are respectively secured to the fingers 26 and 27 by means of screws in such a manner that the positioners 34 and 35 are adjustable vertically through the slots 33.

A sucker tube 36 is detachably attached to the lower end of the spindle 6 in such a manner that the sucker tube 36 is communicated with the suction bore 5. A disk-shaped stopper ring 37 is rigidly secured to the outer peripheral surface of the distal end of the sucker tube 36.

The following is a description of the operation of the chip mounter arranged as detailed above.

Figure 2:
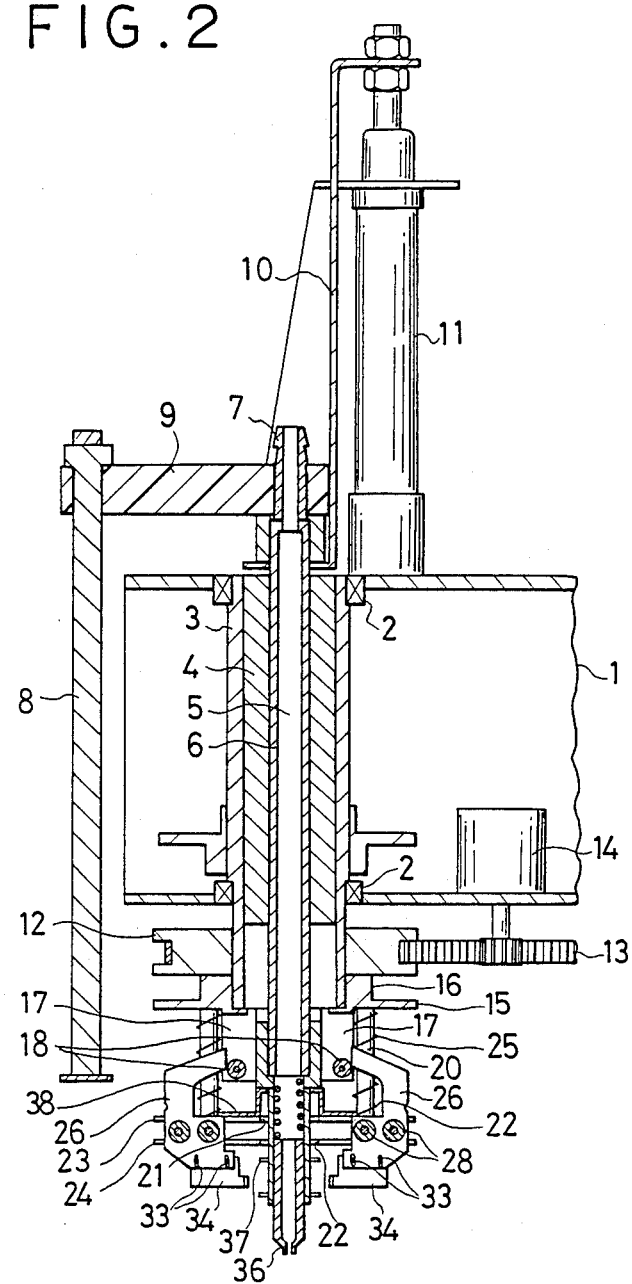
FIG. 2 is a vertical sectional view of the embodiment shown in FIG. 1.
Figure 3:
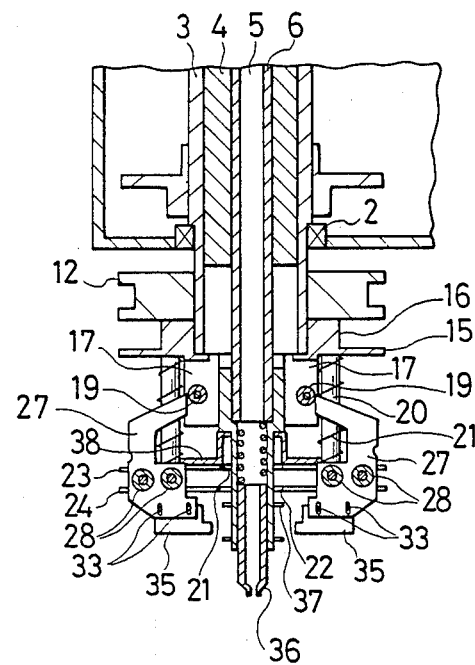
FIG. 3 is a vertical sectional view illustrating another pair of fingers in their assembled state.

Referring first to FIGS. 2 and 3, when the piston rod of the air cylinder 11 is withdrawn, the spindle 6 is moved downward. In consequence, the disks 23 and 24 are disposed at their lowermost end positions by the action of the springs 25, and the fingers 26 and 27 which are retained between the disks 23 and 24 are positioned at their outermost positions through the engagement with the rollers 18 and 19 against the biasing forces from the springs 29. When, in this state, suction is effected by the action of the vacuum pump (not shown) connected to the nipple 7, a chip which is supplied from a parts feeder is suction-held at the distal end of the sucker tube 36.

Figure 4:
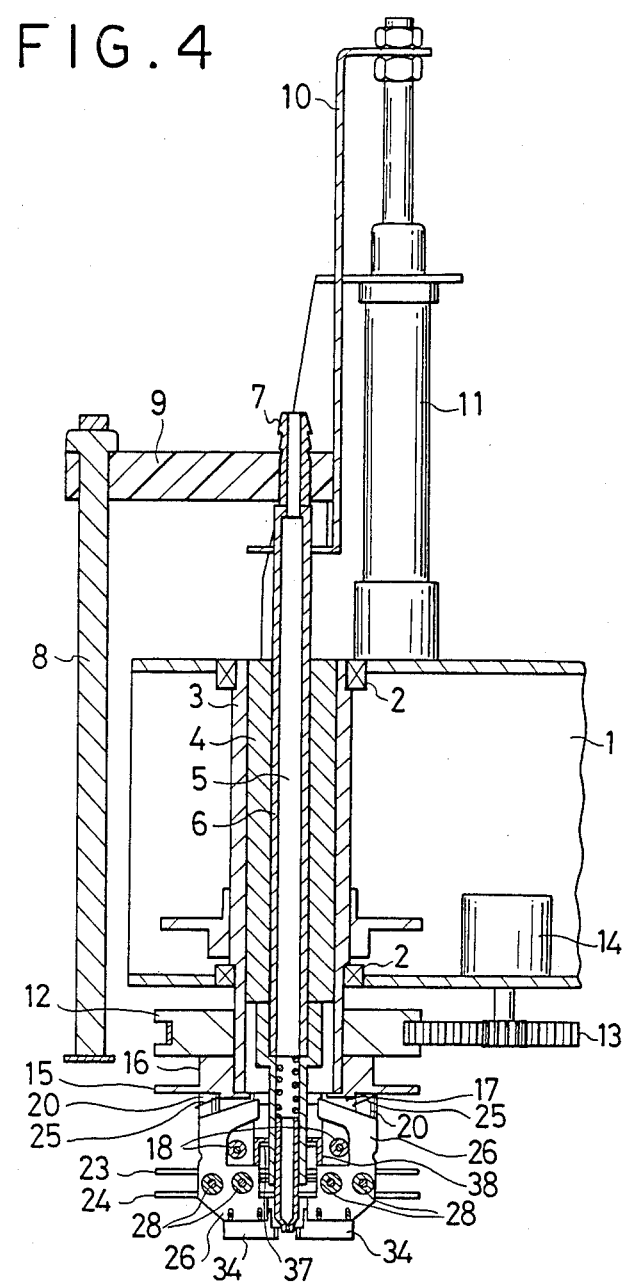
FIG. 4 is a vertical sectional view employed to describe the operation of the embodiment.

When the spindle 6 is moved upward by the action of the air cylinder 11 through the connecting plate 10 as shown in FIG. 4, first the spindle 6 alone is raised while having the chip suction-held at the distal end of the sucker tube 36.

At the same time as the chip is positioned on the same plane as the positioners 34 and 35 secured to the distal ends of the fingers 26 and 27, the stopper ring 37 secured to the sucker tube 36 comes into contact with the inner surface of a mount 38 on the disk 23. Thereafter, the disks 23 and 24 which have the fingers 26 and 27 retained therebetween are moved upward together with the spindle 6 against the biasing forces from the springs 25. As the disks 23 and 24 are thus raised, the slanting inner surfaces of the pair of fingers 26 which are in contact with the lower rollers 18 first slide on the rollers 18, so that the fingers 26 which are subjected to the biasing forces from the push levers 30 cause the rollers 28 to move horizontally inward through the area defined between the disks 23 and 24 while being guided at their upper and lower sides by the disks 23 and 24. In consequence, the pair of fingers 26 start to move linearly and horizontally inward and then the other pair of fingers 27 also start to move linearly and horizontally inward in the same way as the fingers 26.

The positioners 34 which are attached to the fingers 26 first clamp the chip, and the positioners 35 which are attached to the other pair of fingers 27 then clamp the chip while being in slide contact with the positioners 34 attached to the fingers 26. It should be noted that, when both pairs of fingers 26 and 27 have the chip clamped therebetween, their inward movements are stopped, and the rollers 18 and 19 are separated from the slanting inner surfaces of the fingers 26 and 27.

To mount the chip onto a substrate or the like, with the chip mounting mechanism held in the above-described state, the spindle 6 is moved downward by the operation of the air cylinder 11. In consequence, the sucker tube 36 having the chip suction-held at its distal end is lowered, and the fingers 26 and 27 operate in the reverse order to the above to release the chip. When the chip is in contact with the substrate or the like, the operation of the vacuum pump is suspended, and the chip mounting operation is thus completed.

Since in this embodiment the sleeve 3 is connected to the motor 14 through the combination of the pulley 12 and the belt 13, the chip suction-held by the sucker tube 3 can be horizontally rotated through a predetermined angle by rotating the sucker tube 36 by the motor 14, thus allowing the chip to be mounted on a substrate or the like disposed at a separate position.

It should be noted that the present invention is not necessarily limited to the above-described embodiment and the configuration and arrangement of each part or member may be changed or modified as desired without departing from the scope and spirit of the present invention. For example, it is possible to employ only one pair of fingers, or the positioners may be omitted or formed integrally with the fingers. The configuration of the positioners may also be modified.

As has been described in detail above, the chip mounter according to the present invention, in which the fingers which clamp a chip are arranged to move horizontally, enables the chip to be reliably clamped and is capable of handling a plurality of different kinds of chip simply by exchanging the positioners, advantageously.

What is claimed is:

1. A chip mounter comprising: a vertically movable sucker capable of suction-holding a chip; a pair of fingers positioned in the vicinity of said sucker and horizontally movable reciprocatively between a first position where said fingers clamp a chip and a second position where said fingers release said chip; guide means for linearly, reciprocatively guiding said fingers, said guide means having; a support member, a plurality of vertically movable guide plates connected to said support member with a predetermined spacing provided between each pair of adjacent guide plates, and a horizontally extending slide groove in each guide plate; and, a pair of rollers supported by said fingers in sliding contact with said guide plate grooves, whereby said fingers are horizontally movable through engagement of said rollers with said slide grooves while being guided by the space between said guide plates.

2. A chip mounter according to claim 1, wherein said fingers are provided so as to extend in the shape of a cross whose center is defined by the axis of a sucker tube of said sucker.

3. A chip mounter according to claim 1, wherein each of said fingers has a positioner for clamping said chip secured to its distal end in such a manner that the position of said positioner is adjustable in the chip clamping direction.

4. A chip mounter according to claim 1, wherein said fingers are biased inward through two pairs of push levers which are in turn, biased by a biasing spring wound on said support member, and said fingers, which are in opposing relation to each other, are horizontally movable by equal distances by the action of a pair of equalizers pivotally supported between said two pairs of push levers, respectively.

5. A chip mounter according to claim 1, wherein the vertical movement of a sucker tube of said sucker and the horizontal reciprocative movement of said fingers between said chip clamping and said chip releasing positions are effected in interlocking relation to each other.

* * * * *